(12) United States Patent
Choi

(10) Patent No.: US 8,779,497 B2
(45) Date of Patent: Jul. 15, 2014

(54) ELECTRICAL ERASABLE PROGRAMMABLE READ-ONLY MEMORY AND MANUFACTURING METHOD THEREOF

(75) Inventor: Yong Keon Choi, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 160 days.

(21) Appl. No.: 13/438,678

(22) Filed: Apr. 3, 2012

(65) Prior Publication Data

US 2013/0092995 A1 Apr. 18, 2013

(30) Foreign Application Priority Data

Oct. 14, 2011 (KR) ................. 10-2011-0105445

(51) Int. Cl.
*H01L 29/788* (2006.01)
*H01L 21/336* (2006.01)
*H01L 27/115* (2006.01)

(52) U.S. Cl.
CPC ........ H01L 29/7881 (2013.01); H01L 27/1156 (2013.01); H01L 27/11558 (2013.01)
USPC .......................................... 257/315; 438/257

(58) Field of Classification Search
None
See application file for complete search history.

(56) References Cited

U.S. PATENT DOCUMENTS

| 6,177,703 | B1 | 1/2001 | Cunningham | |
|---|---|---|---|---|
| 2007/0045716 | A1* | 3/2007 | Chen et al. | 257/324 |
| 2007/0120175 | A1 | 5/2007 | Tanaka | |
| 2007/0145459 | A1 | 6/2007 | Park et al. | |
| 2008/0057645 | A1* | 3/2008 | Lin et al. | 438/257 |
| 2008/0136602 | A1* | 6/2008 | Ma et al. | 340/10.5 |
| 2009/0170260 | A1* | 7/2009 | Horch | 438/237 |

FOREIGN PATENT DOCUMENTS

| KR | 10-2001-0074775 | 8/2001 |
|---|---|---|
| KR | 10-0660901 | 12/2006 |
| KR | 10-2007-0056969 | 6/2007 |
| KR | 10-2011-0000943 A | 1/2011 |

OTHER PUBLICATIONS

Jung, Eun Hwa, Analog Memory Design of Standard CMOS Process That Have 8BIT Accuracy, Department of Electronics Engineering, Graduate School, Keimyung University.

* cited by examiner

*Primary Examiner* — Fernando L Toledo
*Assistant Examiner* — Valerie N Newton
(74) *Attorney, Agent, or Firm* — Sherr & Jiang, PLLC

(57) ABSTRACT

An electrical erasable programmable read-only memory (EEPROM) including a floating transistor formed on a semiconductor substrate and a tunneling transistor formed on a semiconductor substrate and configured to erase electrons trapped in the floating transistor. The tunneling transistor has a source junction region and a drain junction region that are integrally joined by lateral diffusion. The EPROM maintains a small cell size without any additional mask process, and is useable as an MTP EEPROM because electrical erasure is enabled. In addition, the adjustment of the width of a gate constituting the tunneling transistor ensures an improved degree of freedom to adjust an erasure voltage can be enhanced.

8 Claims, 6 Drawing Sheets

ELECTRICAL ERASABLE
PROGRAMMABLE READ-ONLY MEMORY
AND MANUFACTURING METHOD
THEREOF

The present application claims priority under 35 U.S.C. 119 and 35 U.S.C. 365 to Korean Patent Application No. 10-2011-0105445 (filed on Oct. 14, 2011), which is hereby incorporated by reference in its entirety.

BACKGROUND

Non-volatile memory devices such as EEPROMs or similar devices may be capable of storing information even when the supply of external power is stopped. EPROMs may include an EPROM having a stacked-gate structure in which two polycrystalline silicon layers acting as a gate are vertically stacked, an EPROM having a single gate structure using a single polycrystalline silicon layer, and similar configurations.

Stacked-gate structure EPROMs may be advantageous for high integration of devices, but stacked-gate structure EPROMs may have the drawback of requiring a relatively complicated manufacturing process that includes manufacturing together with logic devices (e.g. metal oxide semiconductor field effect transistors (MOSFET) or complementary MOSFET (CMOSFET) that use a single gate process in a single-layered structure). However, single gate structure EPROMs have a relatively simple standard process, even though single gate structure EPROMs may have drawbacks compared to stacked-gate structure EPROMs in terms of cell integration and performance.

Accordingly, single gate structure EEPROMs may often be embedded in CMOS logic and mixed-signal circuits and usefully applied as low-priced, low-density devices. A single gate structure EPROM may be compatible with a standard logic process and therefore memory cell functions may be added without significant additional processes or cost. Accordingly, single gate structure EPROMs may be easily mounted in a logic device product.

FIG. 1 is a top plan view of an EPROM having a single gate structure and FIG. 2 is a cross-sectional view of the EPROM shown in FIG. 1, in accordance with the related art. An EPROM may include P-type well 12 and N-type well 13 formed in parallel on/over a semiconductor substrate 11. P-type well 12 and N-type well 13 may be isolated from each other by swallow trench isolation (STI) region 14. First gate insulation film 15 may be formed on/over semiconductor substrate 11 where P-type well 12 is formed. First gate 16 or a select gate (SG) may be formed on/over first gate insulation film 15.

An N-type source junction region may be formed in an upper portion of P-type well 12 at one side of first gate 16. An N-type drain junction region may be formed in an upper portion of P-type well 12 at the other side of first gate 16. Accordingly, select NMOS transistor 1 may be formed by first gate 16 and source/drain junction regions 18. Similarly, first gate insulation film 15 may be formed on/over semiconductor substrate 11 where N-type well 13 is formed. Second gate 17 or floating gate (FG) may be formed on/over first gate insulation film 15.

A P-type source junction region may be formed in an upper portion of N-type well 13 at one side of second gate 17. A P-type drain junction region may be formed in an upper portion of N-type well 13 at the other side of second gate 17. Floating PMOS transistor 2 may be formed by second gate 17 and source/drain junction regions 19. Salicide blocking layer 20 may be formed on/over second gate 17, thereby preventing salicide from being formed on second gate 17.

However, EPROMs according to the related art may have a problem that electrical erasure is impossible or unreliable even with the advantage of a simplified standard manufacturing process.

SUMMARY

Embodiments relate to an electrical erasable programmable read-only memory (EEPROM) which is useable as multiple time programmable (MTP) EEPROM with by enabling electrical erasure while maintaining a small cell size through the change of the structure of a single gate EPROM, and a manufacturing method thereof.

Embodiments relate to an EEPROM including at least one of: (1) A floating transistor formed on/over a semiconductor substrate. (2) A tunneling transistor formed on/over a semiconductor substrate and configured to erase electrons trapped in the floating transistor, wherein the tunneling transistor has a source junction region and a drain junction region that are integrally joined by lateral diffusion.

In embodiments, the width of the gate of the tunneling transistor is narrower than the width of the gate of the floating transistor. In embodiments, the gate of the floating transistor has a width ranging from about 0.5 µm to 0.6 µm. In embodiments, the gate of the tunneling transistor has a width ranging from. about 0.16 µm to 0.2 µm. In embodiments, the gate of the tunneling transistor has an end portion intersecting edge portions of the source junction region and the drain junction region at a preset length. In embodiments, the preset length ranges from about 0.16 µm to 0.2 µm.

Embodiments relate to a method for manufacturing an EEPROM including at least one of: (1) Forming a floating gate and a tunneling gate on/over a semiconductor substrate. (2) Forming a floating transistor by forming a source junction region and a drain junction region in contact with the floating gate. (3) Forming a tunneling transistor by forming a source junction region and a drain junction region integrally joined by lateral diffusion in contact with the tunneling gate.

In embodiments, the width of the tunneling gate is formed to be narrower than of the width of the floating gate. In embodiments, an end portion of the tunneling gate is formed to intersect edge portions of the integrally connected source junction region and drain junction region at a preset length. In embodiments, the integrally joined source junction region and drain junction region are formed by an ion implantation process with a tilt of about 25° to 45°. In embodiments, the ion implantation process is performed at an ion implantation energy ranging from about 65 KeV to 100 KeV is used and a dose amount ranges from about $5E12/cm^2$ to $1E13/cm^2$.

BRIEF DESCRIPTION OF THE DRAWINGS

The above and other objects and features of embodiments will become apparent from the following description, given in conjunction with the accompanying drawings, in which.

DETAILED DESCRIPTION

The advantages and features of embodiments and methods of accomplishing these will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

Figure 1:
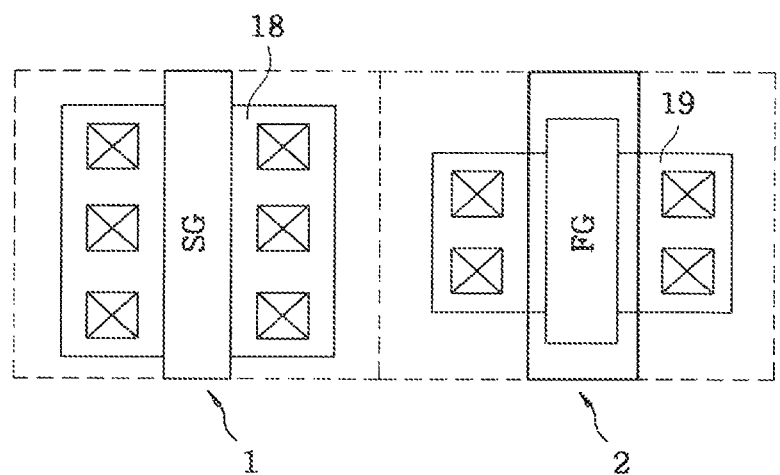
FIG. 1 is a top plan view of an EPROM having a single gate structure, in accordance with the related art.
Figure 2:
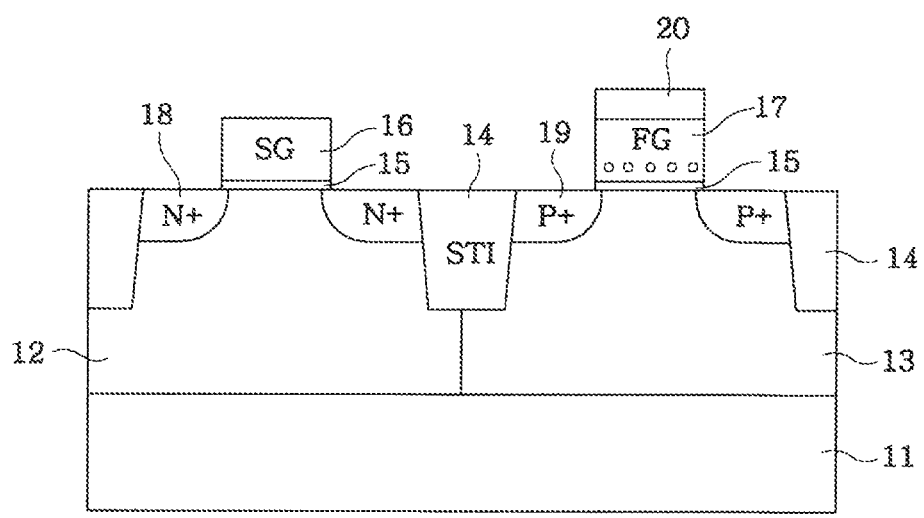
FIG. 2 is a cross-sectional view of the EPROM illustrated in FIG. 1, in accordance with the related art.
Figure 3:
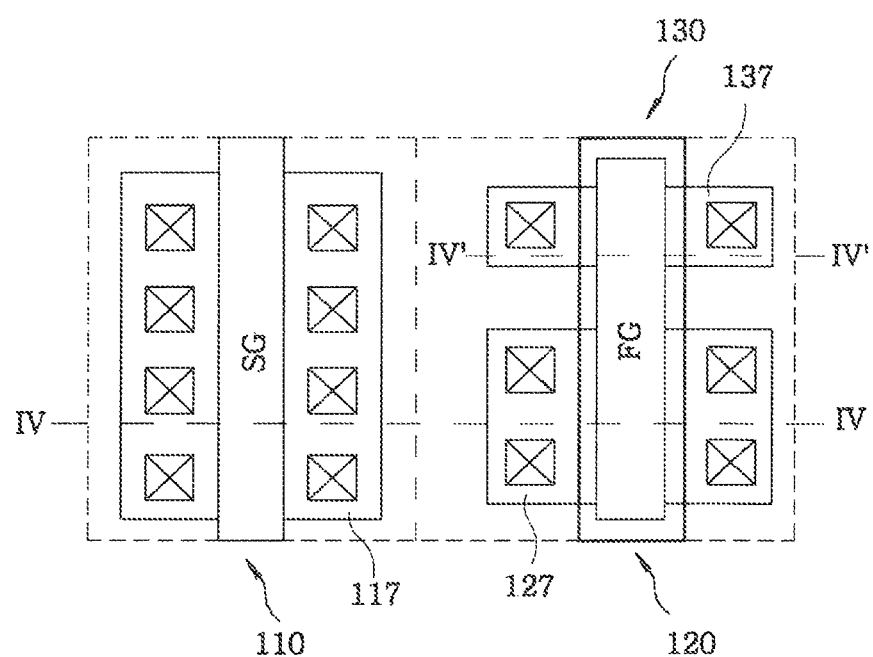
FIG. 3 is a top plan view of an EEPROM, in accordance with embodiments.
Figure 4:
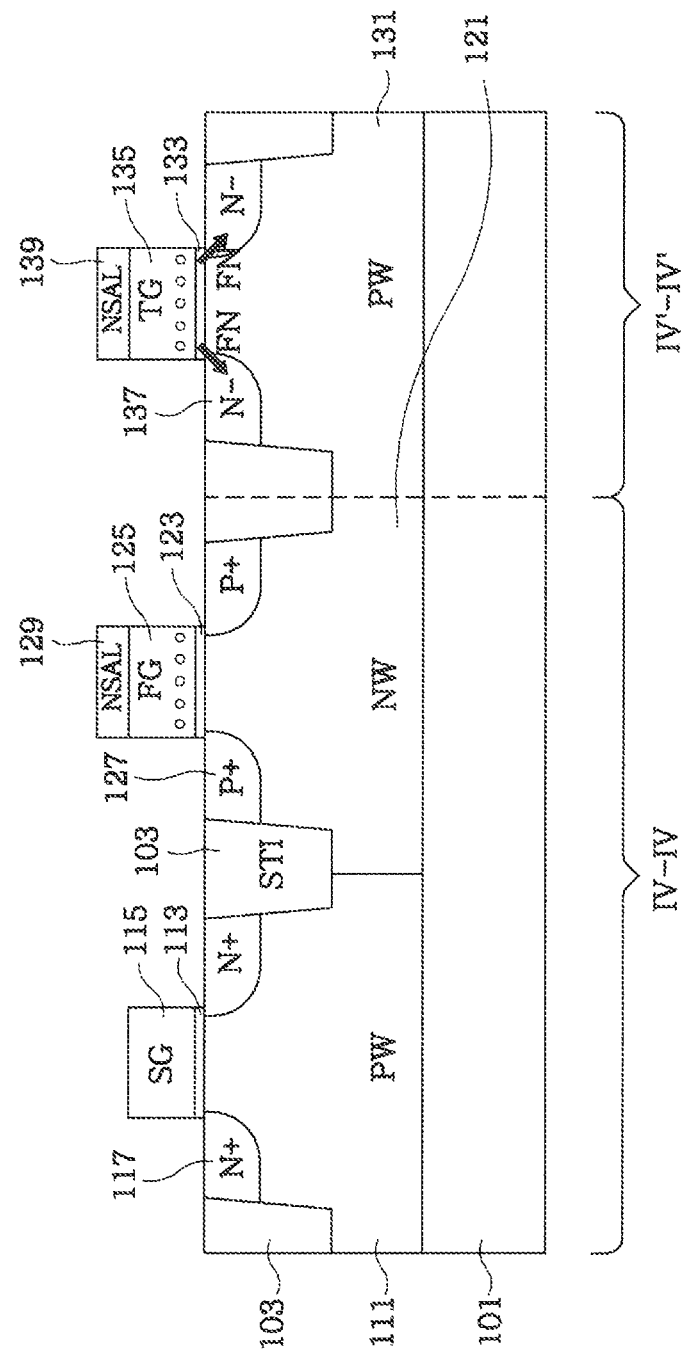
FIG. 4 is a cross-sectional view of the EEPROM illustrated in FIG. 3, in accordance with embodiments.

FIG. 3 is a top plan view of an EEPROM in accordance with embodiments. FIG. 4 is a cross-sectional view of the EEPROM illustrated in FIG. 3, in accordance with embodiments. A cross-sectional view taken along the line IV-IV of FIG. 3 is illustrated on the left in FIG. 4 and a cross-sectional view taken along the line IV'-IV' of FIG. 3 is illustrated on the right in FIG. 4. FIGS. 3 and 4 illustrate only a unit cell region of the EEPROM, in accordance with embodiments.

Referring to FIGS. 3 and 4, an EEPROM in accordance with embodiments includes at least one of (1) Semiconductor substrate 101. (2) First well 111 of a first conductivity. (3) Second well 131 of the first conductivity. (3) Well 121 of a second conductivity. (4) STI region 103. (5) Source/drain junction regions 127 of the first conductivity. (6) First source/drain junction regions 117 of the second conductivity. (7) Second source/drain junction regions 137 of the second conductivity. (8) First gate insulation film 113. (9) Second gate insulation film 123. (10) Third gate insulation film 133. (11) First gate 115. (12) Second gate 125. (13) Third gate 135. (14) First salicide blocking layer 129 or none-salicide (NSAL) layer or similar material. (15) Second salicide blocking layer 139 or none-salicide (NSAL) layer or similar material.

Hereinafter, for convenience of explanation, first well 111 of the first conductivity, second well 131 of the first conductivity, well 121, source/drain junction regions 127 of the first conductivity, first source/drain junction regions 117 of the second conductivity, and second source/drain junction regions 137 of the second conductivity are designated as "P-type first well 111", "P-type second well 131", "N-type well 121", "P-type source/drain junction regions 127", "N-type first source/drain junction regions 117", and "N-type second source/drain junction regions 137", respectively. As such, while the following description will be made on the assumption that the first conductivity means the P-type and the second conductivity means the N-type, they may be interchangeable, in accordance with embodiments.

In embodiments, an EEPROM may be divided into select transistor 110, floating transistor 120, and tunneling transistor 130. A method of manufacturing the EEPROM in accordance with embodiments is illustrated in FIGS. 3 and 4.

First, P-type first well (PW) 111 may be formed on one side of the top of semiconductor substrate 101. N-type well (NW) 121 may be formed at the front part of the other side of the top of the semiconductor substrate 101. P-type second well (PW) 131 may be formed at the rear part of the other side of the top of the semiconductor substrate 101. In embodiments, P-type first well (PW) 111, N-type well (NW) 121, and P-type second well (PW) may be formed next to each other in/on/over semiconductor substrate 110, in that respective order. In embodiments, P-type first well 111, N-type well 121, and P-type second well 131 may be formed at the same depth.

STI region 103 may be formed in an upper portion of the semiconductor substrate 101 to define an active region and an inactive region. P-type first well 111, N-type well 121, and P-type second well 131 may be isolated from each other by STI region 103. In embodiments, as illustrated in FIG. 4, only upper portions of P-type first well 111, N-type well 121, and P-type second well 131 may be isolated by STI regions 103. In embodiments, P-type first well 111, the N-type well 121, and the P-type second well 131 may be fully separated and/or isolated from each other. P-type first well 111 may serve as a base layer for select transistor 110. N-type well 121 may serves as a base layer for floating transistor 120. P-type second well 131 may serves as a base layer for tunneling transistor 130.

In accordance with embodiments, an insulation film and a polysilicon film may be sequentially formed on the top surface of semiconductor substrate 101 and then patterned, thereby forming first gate insulation film 113, second gate instillation film 123, and third gate insulation film 133. First gate (SG) 115 may be formed on/over first gate insulation film 113, which is on/over P-type first well 111, in accordance with embodiments. Second gate 125 may be formed on/over second gate insulation film 123, which is on/over N-type well 121, in accordance with embodiments. Third gate 135 may be formed on/over third gate insulation film 133, which is on/over P-type second well 131, in accordance with embodiments. In embodiments, during these processes, first gate 115, second gate 125, and third gate 135 may be simultaneously formed by the same process, or sequentially formed by separate processes.

In embodiments, a salicide reaction preventing film may be formed before patterning insulation films and a polysilicon film. The salicide reaction preventing film, insulation films, and the polysilicon film may be patterned together to form first salicide blocking layer 129 on/over second gate 125 and second salicide blocking layer 139 on/over third gate 135, in accordance with embodiments. First salicide blocking layer 129 and second salicide blocking layer 139 may prevent salicide from being formed on second gate 125 and third gate 135, in accordance with embodiments.

In embodiments, an N-type source junction region may be formed by ion implantation in an upper portion of P-type first well 111 at one side of the first gate 115 and an N-type drain junction region may be formed in an upper portion of P-type first well 111 at the other side of first gate 115, thereby forming N-type first source/drain junction regions 117 in contact with the first gate 115, in accordance with embodiments. Similarly, a P-type source junction region may be formed by ion implantation in an upper portion of N-type well 121 at one side of second gate 125 and a P-type drain junction region is formed in an upper portion of N-type well 121 at the other side of second gate 125, thereby forming P-type second source/drain junction regions 127 in contact with second gate 125, in accordance with embodiments. Similarly, an N-type source junction region may be formed by ion implantation in an upper portion of P-type second well 131 on one side of third gate 135 and an N-type drain junction region may be formed in an upper portion of P-type second well 131 on the other side of third gate 135, thereby forming N-type second source/drain junction regions 137 in contact with third gate 135, in accordance with embodiments. In embodiments, N-type first source/drain junction regions 117 and N-type second source/drain junction regions 137 may be simultaneously formed by the same process or sequentially formed by separate processes.

In embodiments, select transistor 110 including first gate 115 and first source/drain junction regions 117 may be formed in the region of P-type first well 111. In embodiments, floating transistor 120 including second gate 125 and P-type source/drain junction regions 127 may be formed in the region of N-type well 121. In embodiments, tunneling transistor 130 including third gate 135 and N-type second source/drain junction regions 137 may be formed in the region of P-type second well 131. Though not shown in detail, structures such as a lightly doped drain (LDD) region, a sidewall, a spacer, and the like may be further be selectively included in each transistor region, in accordance with embodiments.

In embodiments, as illustrated in FIG. 4, Fowler-Nordheim (F-N) tunneling may occur in the source junction region and the drain junction region, separately, as indicated by the "arrows". In embodiments, a single gate EPROM may be modified to include tunneling transistor 130 in its structure, while maintaining a relatively small cell size without additional mask processes. In operation, an erasure voltage is applied to a single gate EPROM using tunneling transistor 130, thereby enabling the erasing of electrons trapped in floating transistor 120, in accordance with embodiments.

Figure 5:
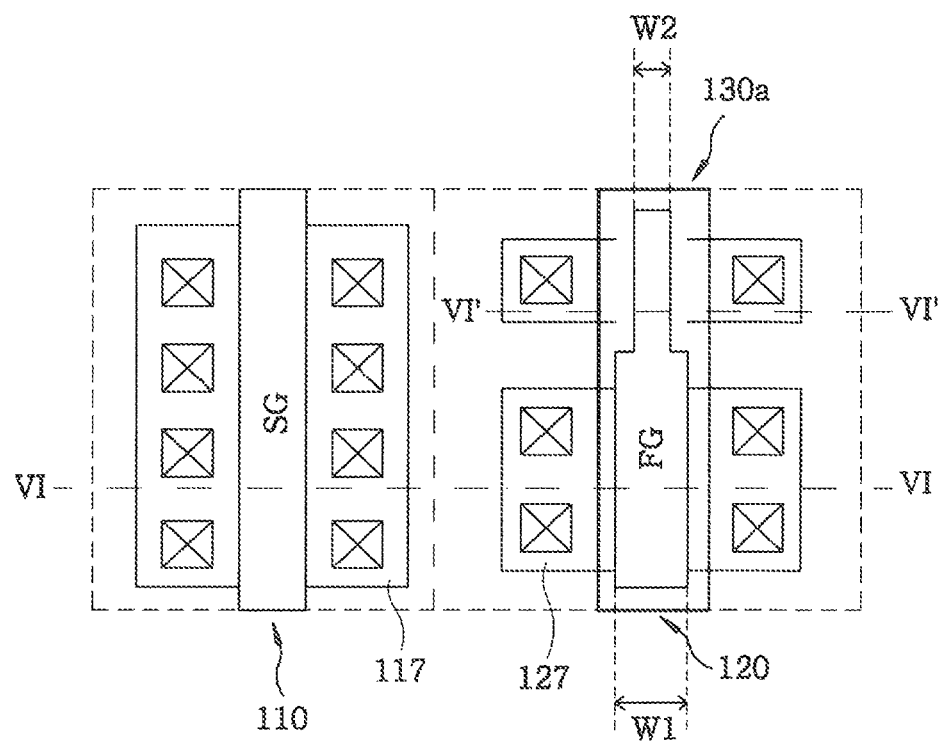
FIG. 5 is a top plan view of an EEPROM, in accordance with embodiments.
Figure 6:
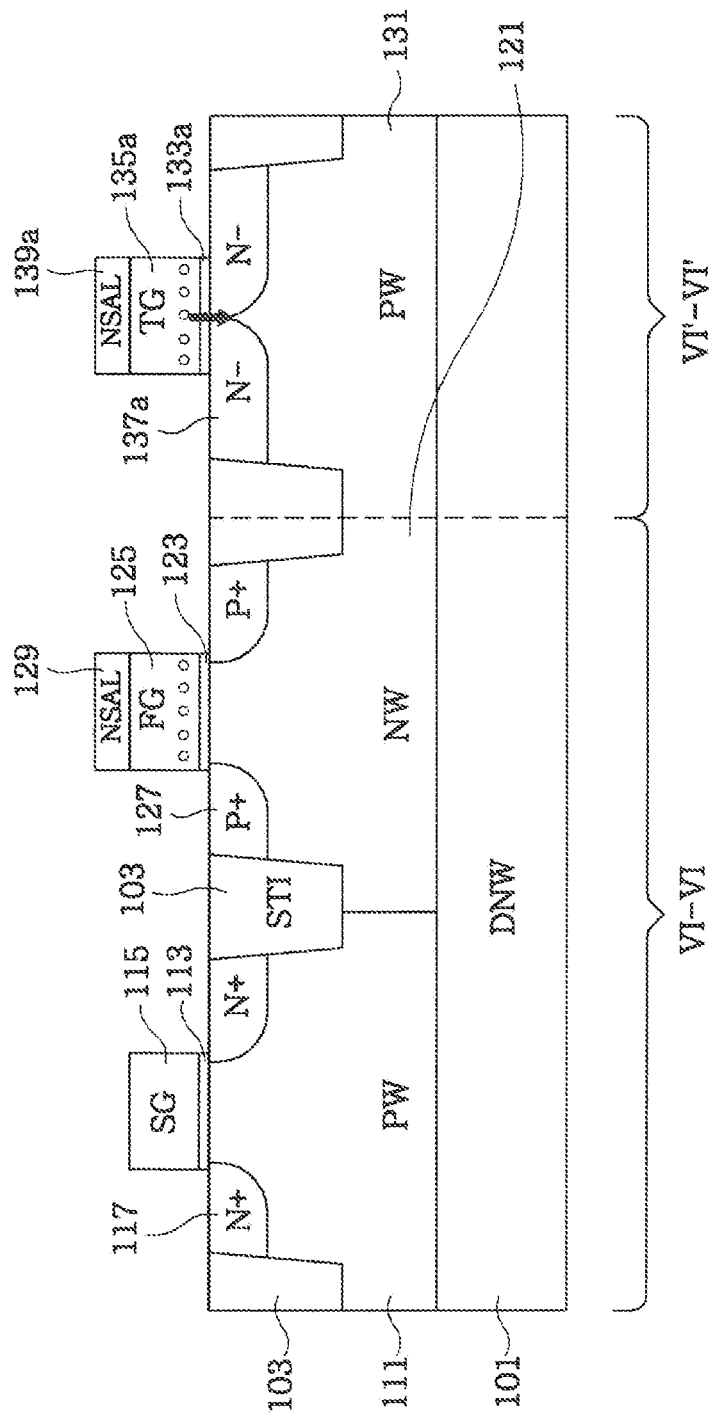
FIG. 6 is a cross-sectional view of the EEPROM, in accordance with embodiments.

FIG. 5 is a top plan view of an EEPROM in accordance with embodiments and FIG. 6 is a cross-sectional view of the. EEPROM illustrated in FIG. 5. A cross-section of line VI-VI of FIG. 5 is illustrated on the left in FIG. 6 and a cross-section of line VI'-VI' of FIG. 5 is illustrated on the right in FIG. 6. FIGS. 5 and 6 illustrate only a unit cell region of an EEPROM, in accordance with embodiments.

Embodiments illustrated in FIGS. 5 and 6 have several similarities with the embodiments illustrated in FIGS. 3 and 4, corresponding with like reference numbers. A notable difference between the embodiments illustrated in FIGS. 5 and 6 is that tunneling transistor 130a may be modified based on modifications of third gate insulation film 133a, a third gate 135a, N-type second source/drain junction regions 137a, and a second salicide blocking layer 139a or none-salicide (NSAL) layer.

In embodiments, in the patterning process for the formation of third gate 135a, the width W2 of third gate 135a may be patterned to be narrower than the width W1 of second gate 125. For example, in embodiments, the width W1 of second gate 125 may be patterned to be between about 0.5 μm and 0.6 μm and the width W2 of third gate 135a may be patterned to be between about 0.16 μm and 0.2 μm.

In embodiments, when the width W2 of third gate 135a is patterned to be narrower than the width W1 of second gate 125, N-type second source/drain junction regions 137a may be formed to be integrally joined by lateral diffusion. The width W2 of third gate 135a may be formed to be narrow so that lateral diffusion occurs during an ion implantation process for formation of N-type second source/drain junction regions 137a, in accordance with embodiments. For example, in embodiments, an ion implantation process for formation of N-type second source/drain junction regions 137a may be performed under the condition that an ion implantation angle with a tilt of about 25° to 45° is used, an ion implantation energy ranging from about 65 KeV to 100 KeV is used, and a dose amount ranges from about 5E12/cm² to 1E13/cm².

In accordance with embodiments, FIG. 6 illustrates F-N tunneling occurring at the connecting portion of source/drain junction regions, as indicated by the "arrow". Embodiments illustrated in FIG. 6 may be distinguished from embodiments illustrated in FIG. 4, as FIG. 4 illustrates Fowler-Nordheim (F-N) tunneling occurring in the source junction region and the drain junction region separately, as indicated by the "arrow". This may contribute to increases in the junction breakdown voltage and may reduce an erase time using a high bias.

Figure 7:
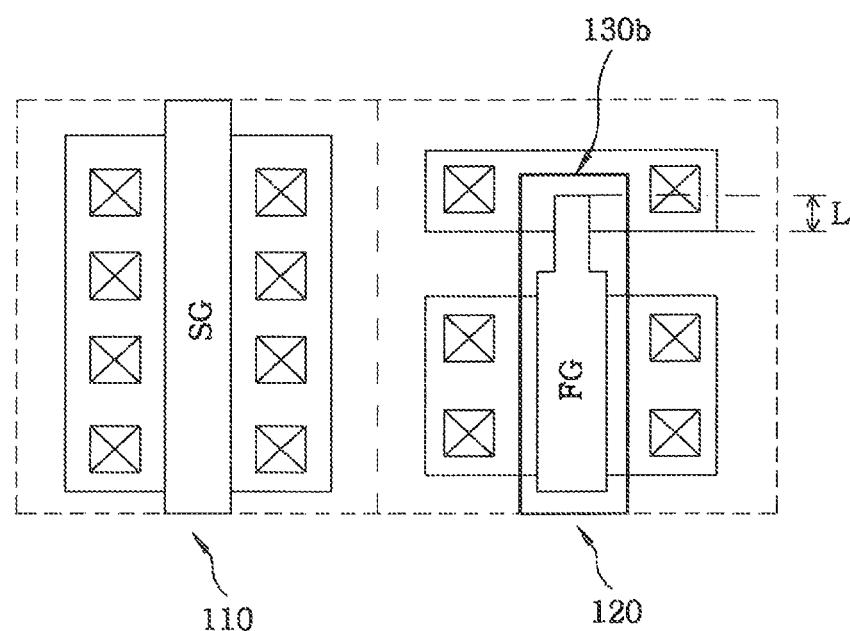
FIG. 7 is a top plan view of an EEPROM, in accordance with embodiments.

FIG. 7 is a top plan view of an EEPROM, in accordance with embodiments. Embodiments illustrated in FIG. 7 have several similarities with the embodiments illustrated in FIG. 5, corresponding with like reference numbers. A notable difference between the embodiments illustrated in FIG. 7 is that tunneling transistor 130b is modified, in accordance with embodiments.

Tunneling transistor 130b may formed by adjusting the length at which an end portion of third gate (135a of FIG. 6) intersects edge portions of N-type second source/drain junction regions (137a of FIG. 6), so as to be reduced by a preset length L, in accordance with embodiments. For example, in embodiments, preset length L may be between about 0.16 μm and 0.2 μm. In embodiments, preset length L may be made substantially equal to the width of third gate 135a of FIG. 6. In embodiments, by adjusting the length at which an end portion of third gate (135a of FIG. 6) intersects edge portions of N-type second source/drain junction regions (137a of FIG. 6) to be reduced, N-type second source/drain junction regions (137a of FIG. 6) may be integrally joined by lateral diffusion and may be formed more easily.

In embodiments, the single gate EPROM may maintain a relatively small cell size by changing its structure without additional mask processes and include a tunneling transistor. Single gate EPROM may be useable as a MTP EEPROM because electrical erasing may be enabled. In embodiments, a single gate structure EEPROM may have a relatively small cell size. In embodiments, a degree of freedom for adjusting an erasure voltage may be enhanced by adjusting the width of a gate constituting the tunneling transistor.

While embodiments have been shown and described, it will be understood by those skilled in the art that various changes and modification may be made without departing the scope of the embodiments as defined the following claims.

What is claimed is:

1. An electrical erasable programmable read-only memory (EEPROM), comprising:
   a floating transistor formed on a semiconductor substrate; and
   a tunneling transistor formed on the semiconductor substrate and configured to erase electrons trapped in the floating transistor, wherein a gate of the tunneling transistor has a narrower width than a gate of the floating transistor,
   wherein the tunneling transistor has a source junction region and a drain junction region that are integrally joined by lateral diffusion.

2. The EEPROM of claim 1, wherein:
   the gate of the floating transistor has a width between approximately 0.5 μm and 0.6 μm; and
   the gate of the tunneling transistor has a width between approximately 0.16 μm and 0.2 μm.

3. The EEPROM of claim 1, wherein the gate of the tunneling transistor has an end portion intersecting edge portions of the source junction region and the drain junction region at a preset length.

4. The EEPROM of claim 3, wherein the preset length is between 0.16 μm and 0.2 μm.

5. A method for manufacturing an electrical erasable programmable read-only memory (EEPROM), the method comprising:
   forming a floating gate and a tunneling gate on a semiconductor substrate;

forming a floating transistor by forming a source junction region and a drain junction region in contact with the floating gate; and forming a tunneling transistor by forming a source junction region and a drain junction region integrally joined by lateral diffusion so as to be in contact with the tunneling gate, wherein a gate of the tunneling transistor has a narrower width than a gate of the floating transistor.

6. The method of claim 5, wherein an end portion of the tunneling gate is formed to intersect edge portions of the integrally connected source junction region and drain junction region at a preset length.

7. The method of claim 5, wherein the integrally joined source junction region and drain junction region are formed by an ion implantation process with a tilt angle between approximately 25° and 45°.

8. The method of claim 7, wherein the ion implantation process is performed under the condition that:
- an ion implantation energy used is between approximately 65 KeV and 100 KeV; and
- a dose amount is between approximately $5E12/cm^2$ and $1E13/cm^2$.

* * * * *